United States Patent [19]

Giddings et al.

[11] Patent Number: 5,596,282

[45] Date of Patent: Jan. 21, 1997

[54] TESTER FOR INTEGRATED CIRCUITS

[75] Inventors: James N. Giddings, Mesquite, Tex.; Robert P. Howell, San Jose, Calif.

[73] Assignee: Texas Instruments Incorporated, Dallas, Tex.

[21] Appl. No.: 502,590

[22] Filed: Jul. 14, 1995

Related U.S. Application Data

[63] Continuation of Ser. No. 165,226, Dec. 10, 1993, abandoned.

[51] Int. Cl.⁶ .................................................. G01R 31/02
[52] U.S. Cl. .......................................... 324/754; 324/758
[58] Field of Search ................................ 324/72.5, 754, 324/758, 158.1, 540, 755, 756, 757

[56] References Cited

U.S. PATENT DOCUMENTS

| | | | |
|---|---|---|---|
| 3,450,259 | 6/1969 | Waltz | 209/573 |
| 3,996,516 | 12/1976 | Luther | 324/754 |
| 4,112,363 | 9/1978 | Morrison et al. | 324/758 |
| 4,362,991 | 12/1982 | Carbine | 324/754 |
| 4,471,298 | 9/1984 | Frohlich | 324/72.5 |
| 4,818,933 | 4/1989 | Kerschner et al. | 324/754 |
| 4,870,354 | 9/1989 | Davaut | 324/761 |
| 5,003,254 | 3/1991 | Hunt et al. | 324/754 |
| 5,047,714 | 9/1991 | Maeno | 324/758 |
| 5,066,907 | 11/1991 | Tarzwell et al. | 324/754 |
| 5,220,285 | 6/1993 | Cerda | 324/540 |
| 5,227,717 | 7/1993 | Tsurishima et al. | 324/754 |
| 5,247,246 | 9/1993 | Van Loan et al. | 324/761 |
| 5,247,250 | 9/1993 | Rios | 324/754 |
| 5,317,255 | 5/1994 | Suyama et al. | 324/754 |
| 5,323,106 | 6/1994 | Saegusa | 324/758 |
| 5,325,052 | 6/1994 | Yamashita | 324/754 |
| 5,347,215 | 9/1994 | Armstrong et al. | 324/158.1 |

*Primary Examiner*—Ernest F. Karlsen
*Assistant Examiner*—Russell M. Kobert
*Attorney, Agent, or Firm*—W. Daniel Swayze, Jr.; W. James Brady, III; Richard L. Donaldson

[57] ABSTRACT

The present invention relates to the field of programming, testing, or burn-in integrated circuits. A testing device is disclosed whereby contact with the leads of an integrated circuit is made while the integrated circuit is in the shipping tray. Contact is made from a jig which is lowered onto the integrated circuit and makes contact at the shoulder of the leads of the integrated circuit, thereby contacting the integrated circuit at the strongest point of the lead and insuring good contact to the desired lead. The testing mechanism may include one jig or more jigs up to one jig for each integrated circuit in an integrated circuit storage tray. The invention allows for the testing of integrated circuits with a minimum of physical movement and manipulation of the integrated circuits.

19 Claims, 3 Drawing Sheets

1

TESTER FOR INTEGRATED CIRCUITS

This application is a continuation, of application Ser. No. 08/165,226, filed Dec. 10, 1993, now abandoned.

FIELD OF THE INVENTION

The present invention relates to the field of testing of integrated circuits. More specifically, the present invention relates to the field of automatic testing or programming of integrated circuits.

BACKGROUND OF THE INVENTION

Before an integrated circuit is placed in a final product, electrical testing must be performed to insure that the integrated circuit is not defective. With the increase in complexity of integrated circuits, the time required to perform the necessary testing has increased exponentially. The complexities of the testing process have become so great that testing has become a bottleneck in the manufacturing process. This is particularly true with custom integrated circuits such as programmable arrays and application specific integrated circuits (ASICs). For these custom circuits, specific, carefully designed testing programs must be performed to insure that the customized integrated circuit meets the customer's specifications.

Present testing techniques utilize a mechanical system whereby the integrated circuit is removed from a storage tray and placed into an electrical socket. This mechanical manipulation requires a certain amount of time. Because this manipulation must be repeated for each integrated circuit, the time lost to the mechanical manipulation is multiplied by the number of integrated circuits in a storage tray. Also, the mechanical manipulation of the integrated circuit increases the possibility that destruction of the chip may occur from cracking the package or bending the lead.

SUMMARY OF THE INVENTION

Disclosed is a device for providing temporary interconnection of a connected device to an integrated circuit, the integrated circuit having a plurality of signal leads extending from an encapsulating package, the device comprising: a tray for holding the integrated circuit; a gantry positioned above the tray for lowering a jig onto the integrated circuit in the tray, the jig having a plurality of conductive contacts positioned to come in contact with said leads when said gantry lowers the jig onto the integrated circuit; and a plurality of leads, one for each of the contacts, one end of the leads being connected to one of the contacts and the other end being connected to the device to be temporarily connected to the integrated circuit.

Also disclosed is a device for providing temporary interconnection of a connected device to more than one integrated circuit, the integrated circuits having a plurality of signal leads extending from an encapsulating package, the device comprising: a tray for holding the integrated circuit; a gantry positioned above the tray for lowering more than one jig onto the integrated circuit in the tray, the jigs having a plurality of conductive contacts positioned to come in contact with said leads when said gantry lowers the jigs onto the integrated circuits; and a plurality of leads, one for each of the conductive contacts, one end of the leads being connected to one of the contacts and the other end being connected to the device to be temporarily connected to the integrated circuit.

DETAILED DESCRIPTION

Figure 1:
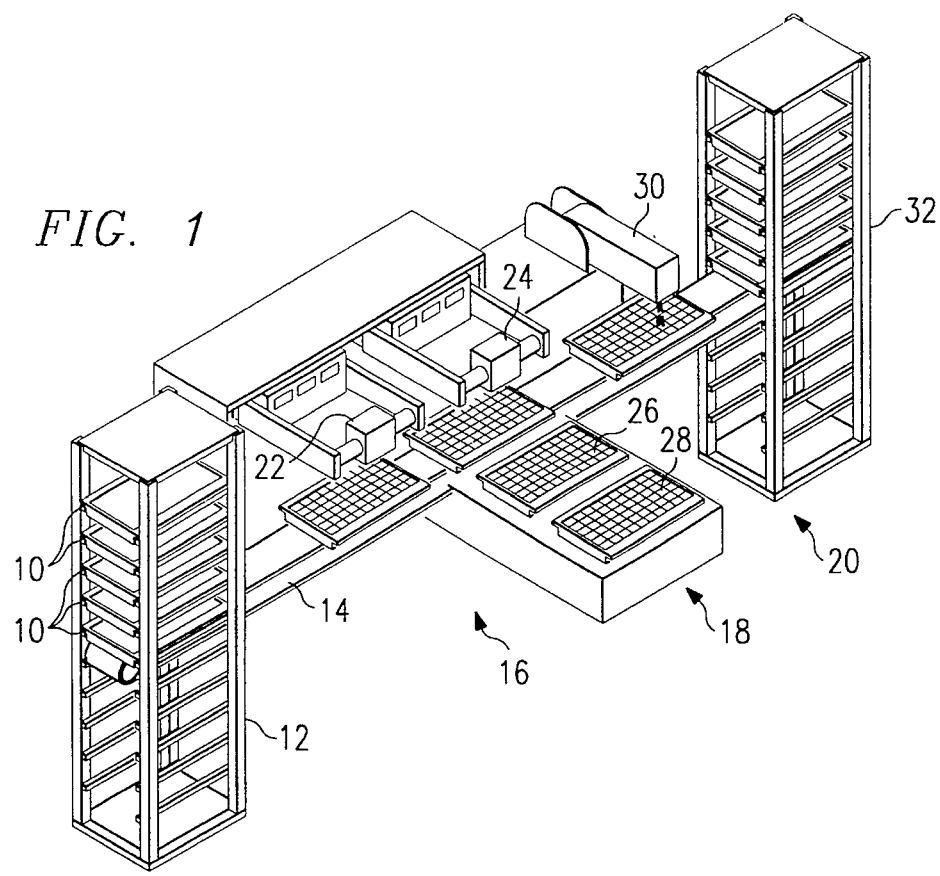
FIG. 1 is a perspective view of a conveyor system including the use of the present invention, for testing integrated circuits.

FIG 1 is a perspective view of an integrated circuit testing station in accordance with the present invention. Trays of integrated circuits 10 are placed in a rack 12. Conveyor 14 selectively selects trays from rack 12 to pass along beneath testing station 16 rejects/refill station 18 and laser marking station 20. Gantry 22 lowers testing apparatus onto the integrated circuits stored in the tray positioned below gantry 22. Gantry 24 removes the bad integrated circuits identified at testing station 16 from the tray and places the bad chips in tray 26. Previously tested, good integrated circuits are placed in tray 28 and are used to replace the bad circuits removed by gantry 24. This may be done by gantry 24 grabbing the integrated circuits using a vacuum grasping device or may be done manually. Once a complete tray of good integrated circuits is assembled, the tray is passed on to laser marking station 20 where the appropriate laser markings are burned into the surface of the integrated circuit using a laser manipulated by gantry 30. When marking is completed, the marked trays of good integrated circuits are placed on rack 32 and are subsequently sealed and shipped.

Figure 2:
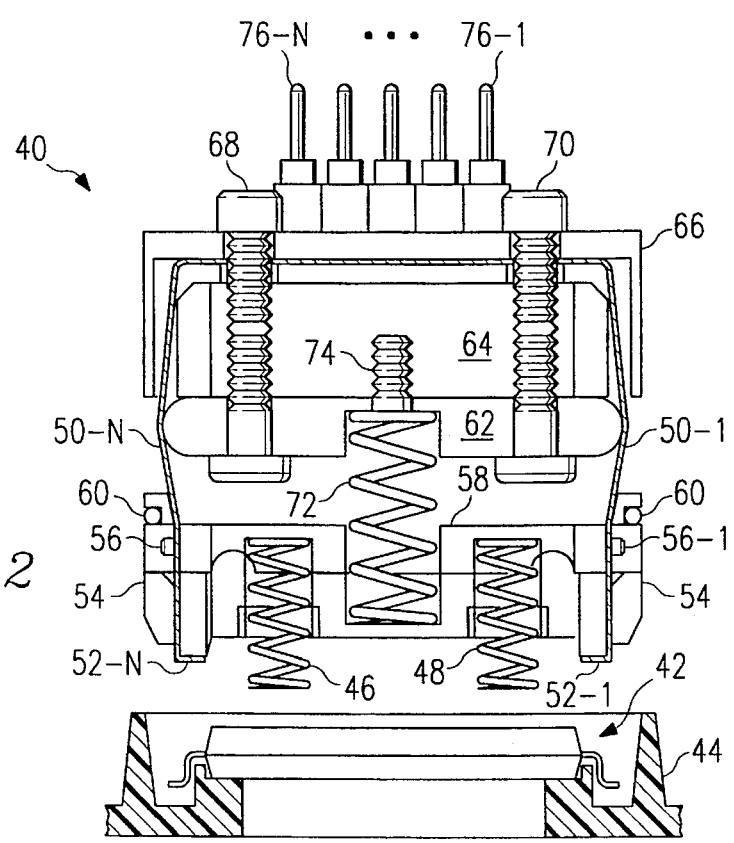
FIG. 2 is cross section view of one integrated circuit resting in a storage tray and a jig according to the present invention disposed above said integrated circuit.

FIG. 2 is a cross sectional view of a jig 40 for testing an individual integrated circuit 42 placed in a tray 44. Tray 44 is fabricated from an appropriate molded plastic such as carbon filled, conductive black polyethene. Tray 44 must be capable of being molded into a specific configuration and stiff enough to avoid excess movement of the integrated circuits stored in tray 44 but flexible enough to avoid being brittle. Springs 46 and 48 provide buffering between integrated circuit 42 and jig 40 when jig 40 is lowered onto integrated circuit 42. Also, springs 46 and 48 provide compression to help hold integrated circuit 42 in place during testing. Leads 50-1 through 50-N are a plurality of leads, one for each lead of integrated circuit 42. Leads 50-1 through 50-N are fabricated from a suitably conductive and springy metal such as beryllium, copper, platinum, gold, silver, stainless steel, or flexible printed circuit board material. As jig 40 is lowered onto integrated circuit 42 leads 50-1 through 50-N make contact with the outside curvature of the leads of integrated circuit 42 at contact points 52-1 through 52-N. Because contact points 52-1 through 52-N are positioned above the curved portion of the leads of integrated circuit 42, the bottom surface of contact points 52-1 through 52-N will find a point of good contact regardless of the precise orientation of the surfaces of contact points 52-1 through 52-N. Contact points 52-1 through 52-N are also plated in gold to provide a high quality corrosion-free contact point for the shoulder of the leads of integrated circuit 42. Also, an optional particle coating comprising of the particle interconnect material disclosed in U.S. Pat. Nos. 4,804,132, and 5,033,697 may be formed on contact points 52-1 through 52-N. Contacts 52-1 through 52-N are designed to contact the shoulders of the leads of integrated circuit 42 to provide an area which may contact the lead at any point along the curvature and also because the shoulder area of the lead provides improved strength and less likelihood of package breakage as opposed to contacting the leads closer to the edge of the integrated circuit.

Leads 50-1 through 50-N are designed to provide an outward spring-type bias which is contained by retainer ring 54. Pins 56-1 through 56-m are provided from block 58 in between leads 50-1 through 50-N to position block 58 and retainer ring 54. The assembly is held in place by rubber band 60. The outward bias on leads 50-1 through 50-N is maintained by tension block 62. Tension block 62 and assembly block 64 are held to cap 66 by allen bolts 68 and 70. Tension is maintained between the upper portion of the assembly and block 58 by spring 72 which is held in place by screw 74. The tensioning features of leads 50-1 through 50-N provides buffering between the upper portion of jig 40, which is solidly connected to gantry 22 (FIG. 1), and the leads of integrated circuit 42 to avoid excessive force on the leads of integrated circuit 42 which may cause cracking of the encapsulating material of integrated circuit 42 or damage the leads themselves.

Figure 3:
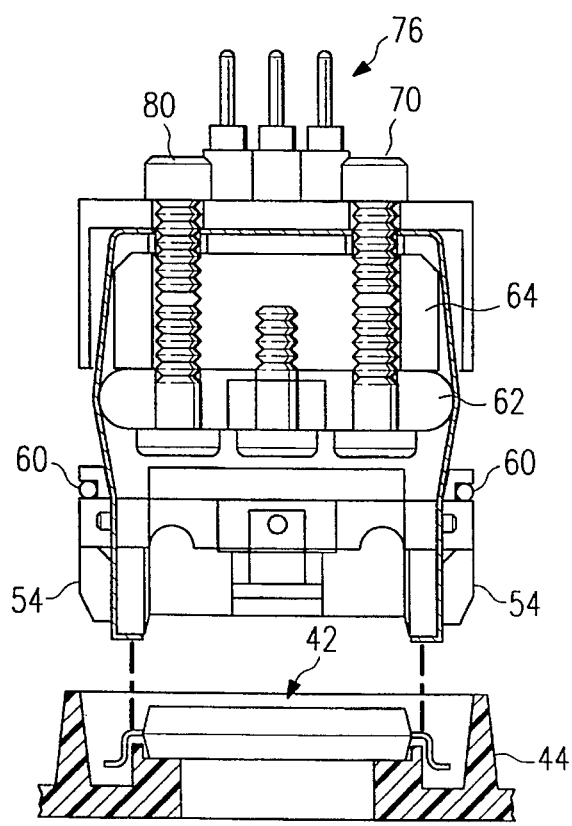
FIG. 3 is an orthogonal cross section perpendicular to schematic view of FIG. 2.

Integral with cap 66 is a printed circuit board (not shown) which makes contact to leads 50-1 through 50-N an may be soldered thereto. The printed circuit board provides separate electrical path from each lead 50-1 through 50-n to pins 76-1 through 76-N. Pins 76-1 through 76-N are inserted into corresponding sockets in gantry 22 of FIG. 1 which provide electrical interconnection to the circuitry which performs the electrical testing on integrated circuit 42. In this configuration, it is possible to imbed electrical components in the actual test head. FIG. 3 is an orthogonal cut-away view to the view of FIG. 2.

Figure 4:
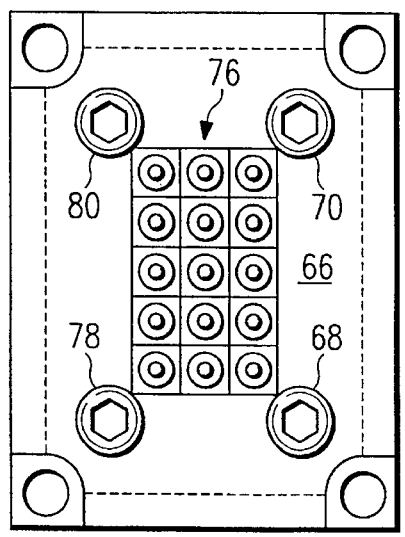
FIG. 4 is a top view of the jig and pin structure of the jig shown in FIGS. 2 and 3.

FIG. 4 is a top view of cap 66 showing a pin configuration where pins 76-1 through 76-N where N is equal to 15. Any number of pins 76-1 through 76-N can be formed in accordance with this invention to provide all necessary contact points to fully test integrated circuit 42 of FIGS. 2 and 3.

Figure 5:
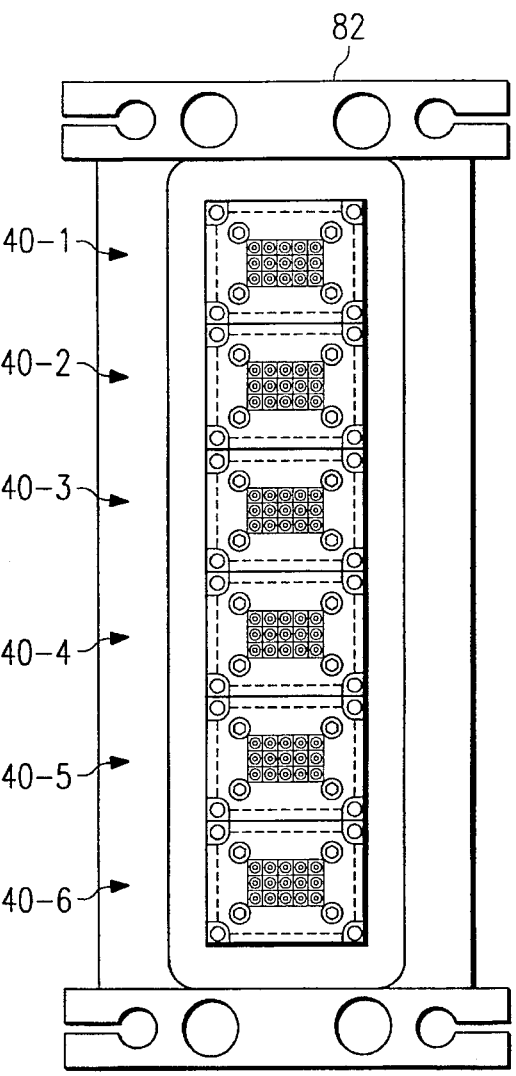
FIG. 5 is a top view of another embodiment of the present invention wherein multiple jigs are used to test multiple integrated circuits at one time.

FIG. 5 is a top view of a rack 82 containing six jigs 40-1 through 40-6 in the embodiment shown in FIG. 5, an entire row of integrated circuits in tray 44 (FIG. 1) are tested and gantry 22 (FIG. 1) steps sequentially down each row of integrated circuits in tray 44. Gantry 22 holds the rack in place while the testing procedure is conducted and then moves to the next row for complete testing of the next row.

Figure 6:
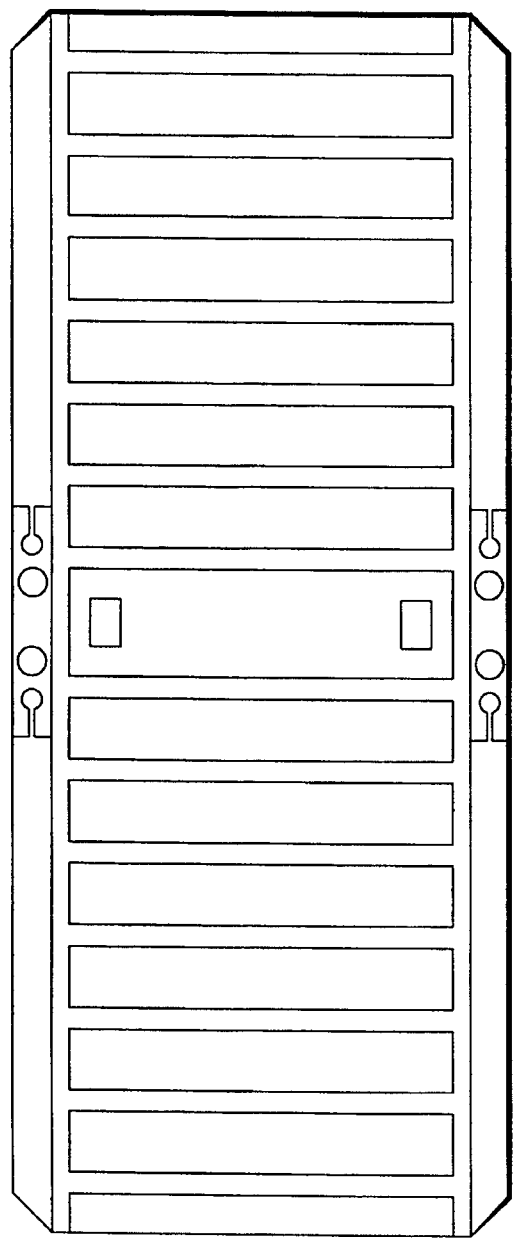
FIG. 6 is a top view of a plate, on which a tray of devices will sit, and which would have a support mechanism to interface with the row of contact heads shown in FIG. 5.
Figure 7:
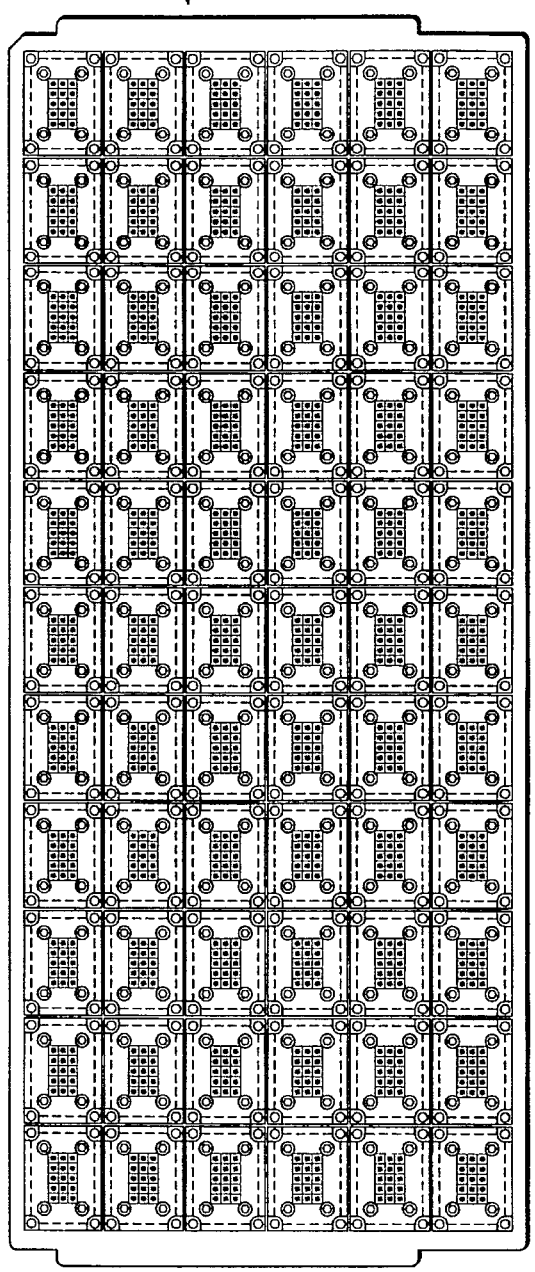
FIG. 7 is a top view of an arrangement of multiple jigs for testing all integrated circuits which would be stored in the tray of FIG. 6.

FIG. 6 is a top view of a plate for supporting a tray with integrated circuits positioned six circuits side-by-side for testing using rack 82 and testing jigs 40-1 through 40-6. FIG. 7 is a rack 84 comprising another embodiment of the present invention wherein sixty-six jigs 40 are positioned six wide and eleven deep to provide simultaneous testing of sixty-six integrated circuits. This will provide complete testing of an entire tray of sixty-six integrated circuits at one time. Of course, necessary driving circuitry for each of the jigs is required at testing station 16 (FIG. 1).

FIG. 7 is merely an example of a whole-tray test head array, 66 jigs is only one possible array and other array sizes are possible.

Although specific embodiments of the present invention described herein, this detailed description is not intended to be limiting to the scope of the invention. Other embodiments of the present invention will become apparent to those skilled in the art in light of the teachings of the specification. For example, the present embodiments show that the jigs are lowered onto the integrated circuit. However, any movement which properly positions the jig onto the leads of the tested integrated circuit will accomplish the desired result. The scope of the invention is limited only by the claims appended hereto wherein:

We claim:

1. A device for providing temporary interconnection of a connected device to an integrated circuit, said integrated circuit having a plurality of signal leads extending from an encapsulating package, the plurality of signal leads having a shoulder adjacent said encapsulating package, comprising:

a socketless tray for holding said integrated circuit;

a gantry positioned above said tray for lowering a jig onto said integrated circuit in said tray, said jig having a plurality of conductive contacts positioned to come in contact with said signal leads at the shoulder of said signal leads when said gantry lowers said jig onto said integrated circuit; and a plurality of leads to move in a direction substantially perpendicular to a plane defined by said shoulder of said signal leads, one for each of said contacts, having a first end and a second end, the first end of each of said leads being connected to one of said contacts and the second end of said leads being connected to said connected device to be temporarily interconnected to said integrated circuit.

2. A device as in claim 1 wherein said connected device is an integrated circuit tester.

3. A device as in claim 1 further comprising a conveyor for moving said tray into position beneath said gantry.

4. A device as in claim 1 wherein said leads have a bend and said contacts are positioned to contact said leads on the outer surface of said bend.

5. A device for providing temporary interconnection of a connected device to a plurality of integrated circuits, said integrated circuits having a plurality of signal leads extending from an encapsulating package, the plurality of signal leads having a shoulder adjacent said encapsulating package, comprising:

a socketless tray for holding said integrated circuits;

a gantry positioned above said tray for lowering a plurality of jigs onto said integrated circuits in said tray, said jigs having a plurality of conductive contacts positioned to come in contact with said signal leads at the shoulder of said signal leads when said gantry lowers said jigs onto said integrated circuits; and a plurality of leads to move in a direction substantially perpendicular to a plane defined by said shoulder of said signal leads, one for each of said conductive contacts, having a first end and a second end, the first end each of said leads being connected to one of said contacts and the second end being connected to said connected device to be temporarily interconnected to said integrated circuits.

6. A device as in claim 5 wherein said connected device is an integrated circuit tester.

7. A device as in claim 5 further comprising a conveyor for moving said tray into position beneath said gantry.

8. A device as in claim 5 wherein said leads have a bend and said contacts are positioned to contact said leads on the outer surface of said bend.

9. A device as in claim 5 wherein there is a jig for each integrated circuit in said tray.

10. A method for providing temporary interconnection of a connected device to an integrated circuit, said integrated circuit having a plurality of signal leads extending from an encapsulating package, the plurality of signal leads having a shoulder adjacent said encapsulating package, comprising:

provided a socketless tray for holding said integrated circuit;

positioning a jig onto said integrated circuit in said tray, said jig having a plurality of conductive contacts positioned to come in contact with said signal leads at the shoulder of said signal leads when said jig is positioned onto said integrated circuit; and moving a plurality of leads in a direction substantially perpendicular to a plane defined by said shoulder of said signal leads, one for each of said contacts, having a first end and a second end, the first end of each of said leads being connected to one of said contacts and the second end being connected to said connected device to be temporarily interconnected to said integrated circuit.

11. A method as in claim 10 wherein said connected device is an integrated circuit tester.

12. A method as in claim 10 further comprising providing a conveyor, said conveyor moving said tray into a position in preparation of positioning said jig on said integrated circuits.

13. A method as in claim 10 wherein said leads have a bend and said contacts are positioned to contact said leads on the outer surface of said bend.

14. A method for providing temporary interconnection of a connected device to a plurality of integrated circuits, said integrated circuits having a plurality of signal leads extending from an encapsulating package, the plurality of signal leads having a shoulder adjacent said encapsulating package, comprising:

providing a socketless tray for holding said integrated circuits;

lowering a plurality of jigs onto said integrated circuits in said tray, said jigs having a plurality of conductive contacts positioned to come in contact with said signal leads at the shoulder of said signal leads when said jigs are lowered onto said integrated circuits; and moving a plurality of leads to move in a direction substantially perpendicular to a plane defined by said shoulder of said signal leads, one for each of said conductive contacts, having a first end and a second end, the first end of each of said leads being connected to one of said contacts and the second end being connected to said connected device to be temporarily interconnected to said integrated circuit.

15. A method as in claim 14 wherein said connected device is an integrated circuit tester.

16. A method as in claim 14 further comprising providing a conveyor for moving said tray into position beneath said jigs.

17. A method as in claim 14 further comprising vibrating said tray to ensure said integrated circuit is in proper position in said tray before lowering said jigs in to place on said integrated circuits.

18. A method as in claim 14 wherein said leads have a bend and said contacts are positioned to contact said leads on the outer surface of said bend.

19. A method as in claim 14 wherein there is a jig for each integrated circuit in said tray.

* * * * *